(12) United States Patent
Norton et al.

(10) Patent No.: US 10,136,544 B2
(45) Date of Patent: Nov. 20, 2018

(54) DUAL IN-LINE MEMORY MODULE CONNECTOR

(71) Applicant: HEWLETT PACKARD ENTERPRISE DEVELOPMENT LP, Houston, TX (US)

(72) Inventors: John Norton, Houston, TX (US); Melvin K Benedict, Magnolia, TX (US); John P Franz, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 50 days.

(21) Appl. No.: 15/315,380

(22) PCT Filed: Jul. 8, 2014

(86) PCT No.: PCT/US2014/045641
§ 371 (c)(1),
(2) Date: Nov. 30, 2016

(87) PCT Pub. No.: WO2016/007129
PCT Pub. Date: Jan. 14, 2016

(65) Prior Publication Data
US 2017/0196113 A1    Jul. 6, 2017

(51) Int. Cl.
| | |
|---|---|
| H01R 12/00 | (2006.01) |
| H05K 7/14 | (2006.01) |
| H05K 7/20 | (2006.01) |
| H01R 12/73 | (2011.01) |
| H01R 13/629 | (2006.01) |

(52) U.S. Cl.
CPC .......... *H05K 7/1431* (2013.01); *H01R 12/73* (2013.01); *H01R 13/629* (2013.01); *H05K 7/20418* (2013.01); *H01R 2201/06* (2013.01)

(58) Field of Classification Search
CPC .. H05K 7/1431; H05K 7/20418; H01R 12/73; H01R 13/629; H01R 2201/06
USPC ..................................................... 439/59, 329
See application file for complete search history.

(56) References Cited

U.S. PATENT DOCUMENTS

| | | | |
|---|---|---|---|
| 5,966,287 | A | 10/1999 | Lofland |
| 7,484,978 | B1 | 2/2009 | Gao |
| 7,609,523 | B1 | 10/2009 | Ni |
| 7,684,196 | B2 | 3/2010 | Eckberg |
| 8,004,841 | B2 | 8/2011 | Cipolla |
| 2007/0254526 | A1 | 11/2007 | Lai |
| 2008/0064240 | A1 | 3/2008 | Pennypacker |
| 2008/0096412 | A1 | 4/2008 | Poh |
| 2008/0256281 | A1 | 10/2008 | Fahr et al. |

(Continued)

FOREIGN PATENT DOCUMENTS

| | | |
|---|---|---|
| TW | 438113 | 5/2001 |
| TW | 201312859 A1 | 3/2013 |

OTHER PUBLICATIONS

Anthony Garreffa, "Corsair Unveils Its DDR4 Memory at Computex 2014," Jun. 2, 2014, http://www.tweaktown.com/news/381521/cosair-unveils-its-ddr4-memory-at-computex-201.

(Continued)

*Primary Examiner* — Khiem Nguyen
(74) *Attorney, Agent, or Firm* — Brooks, Cameron & Huebsch, PLLC

(57) ABSTRACT

A dual in-line memory module (DIMM) connector can include a double data rate fourth generation (DDR4) DIMM connector to connect to a DIMM via a lowest notch of the DIMM relative to an electronic component on which the DIMM is located.

11 Claims, 3 Drawing Sheets

(56) References Cited

U.S. PATENT DOCUMENTS

2009/0017665 A1  1/2009  Hul
2009/0190304 A1  7/2009  Meyer
2009/0277616 A1  11/2009 Cipolla et al.
2011/0159718 A1  6/2011  McKee

OTHER PUBLICATIONS

PCT/ISA/KR, International Search Report, dated Mar. 24, 2015, PCT/US2014/045641, 12 pps.

DUAL IN-LINE MEMORY MODULE CONNECTOR

BACKGROUND

Dual in-line memory modules (DIMMs) include a series of dynamic random access memory (DRAM) integrated circuits, and may be used in personal computers, workstations, and servers, among others. Connectors can be used to connect or mount electronic components to these DIMMs.

DETAILED DESCRIPTION

DIMM connectors can be used within a system to connect (e.g., mount) an electronic component to a DIMM. Some DIMM connectors (e.g., double data rate fourth generation (DDR4) DIMM connectors) can utilize an upper notch of a DIMM and have a seating plane of approximately 2.5 millimeters from a surface of an electronic component on which it is located, for instance, a printed circuit board (PCB). However, this can leave the lower notch of the DIMM unused and the DIMM underutilized.

Some other DIMM connectors (e.g., double data rate third generation (DDR3) DIMM connectors) can utilize a lower notch in DIMM; however, these systems do not include functionalities allowing for use of both an upper and a lower notch in a DIMM. For instance, while a DDR3 connector may utilize a lower notch in a DIMM, another electronic component may not be received by or take advantage of the upper notch.

In contrast, examples of the present disclosure include a DIMM connector that can utilize a lower notch of the DIMM and includes a lowered seating plane. This can free an upper notch of the DIMM for attachment of a first electronic component to the DIMM while connecting a second electronic component, such as a PCB, to the DIMM via the lower notch. The lowered seating plane may allow for increased space above the DIMM to allow placement of an additional electronic component.

Figure 1:
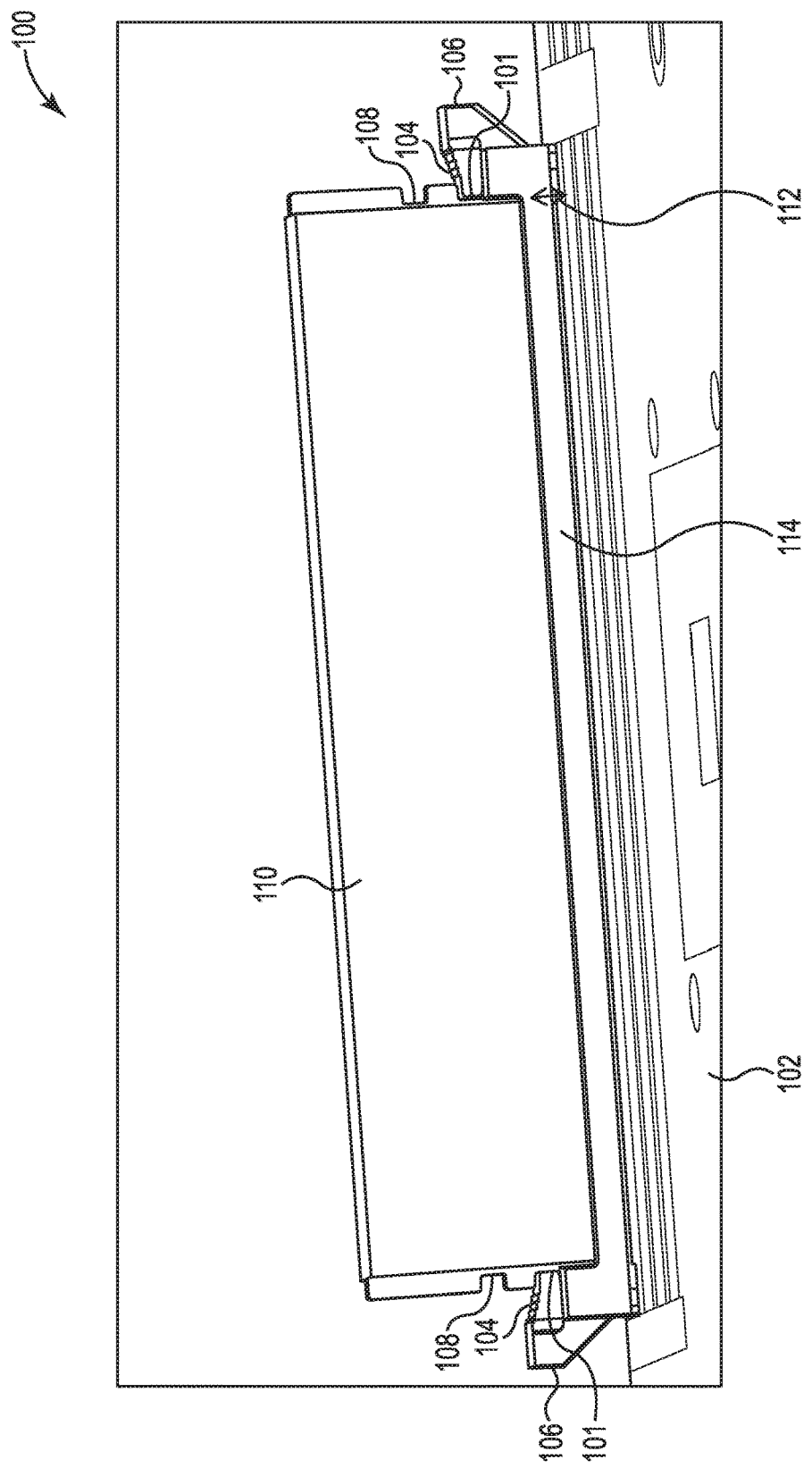
FIG. 1 illustrates a diagram of an example of a system according to the present disclosure.

FIG. 1 illustrates a diagram of an example of a system 100 according to the present disclosure. System 100 includes a DIMM 110 connected to an electronic component 102 via a DIMM connector apparatus that includes connector portions 104, connector arms 106, and body portion 114. In some examples, the DIMM connector apparatus can include a DDR4 DIMM connector, and DIMM 110 can include a DDR4 DIMM.

System 100 can also include two notches in DIMM 110. A first notch, also known as an "upper notch" or "highest notch" 108 can be located above a second notch 101, also known as a "lower notch" or "lowest notch" relative to electronic component 102 to which DIMM 110 module is connected. In some examples, electronic component 102 can include a PCB.

To connect electronic component 102 to DIMM 110, DIMM 110 can be placed into the body portion 114 of the DIMM connector apparatus, and the connector portion 104 of the DIMM connector apparatus can be inserted into notch 101 of DIMM 110. DIMM 110 may be connected to electronic component 102 in a number of manners including, for instance, surface mount or through-hole, among others.

In a number of examples, connector arms 106, also known as latching arms or latching mechanisms, are shorter than other approaches. For instance, connector arms 106 may include a length that falls below a threshold length. This shorter length can allow for connection to the lower notch 101 without blocking access to the upper notch 108. This is in contrast to other approaches in which connector arms connect to an upper notch and block any access to a lower notch, rendering the lower notch unusable.

Additionally, in a number of examples, the shortened length of connector arms 106 and the connection at lower notches 101 may reduce the angle (e.g., rotation angle) at which the connector arms 106 and connection portions 104 are connected to DIMM 110. For instance, the shorter connector arms 106 reduce the amount of space used by the connector arms 106 and connector portions 104 when rotated in an unlatched position. The space used can be driven, for example, by a geometry principle:

$$S = R * \theta,$$

where S is an arc length, R is a radius, and $\theta$ is an angle. This can reduce the space needed for the connection arms 106 to swing past body portion 114 to connect to DIMM 110, resulting in less space needed between DIMM 110 and a neighboring DIMM. This can allow for neighboring DIMMs to be positioned closer to one another, resulting in a more efficient use of PCB space. For instance, examples of the present disclosure may require less space for connector arms 106 to swing, as compared to other approaches requiring more space for connector arms 106 to swing (e.g., in order to reach an upper notch), allowing for more DIMMs per PCB. Additionally or alternatively, the space gained can allow for more components in the assembly, improved layout options, and can provide improved thermals via reduced airflow obstruction, among others.

In some examples, DIMM connector apparatus, and in particular, the body portion 114 can include a seating plane 112 with a smaller distance between the body portion 114 and electronic component 102 as compared to other seating planes. Seating plane 112 may fall into a particular threshold; for instance, seating plane 112 can include a distance of (include a threshold of) approximately 1.1 millimeters. That is, seating plane 112 may be approximately 1.1 millimeters from the surface of electronic component 102. As used herein, "approximately" can include a distance within a particular margin, range, and/or threshold. A seating plane, as used herein, can include a plane of contact made when package leads are allowed to rest freely on a flat horizontal surface. As will be discussed further herein with respect to FIG. 3, a lower seating plane can allow for placement of an electronic component above DIMM 110, meaning more components available in the system.

Figure 2:
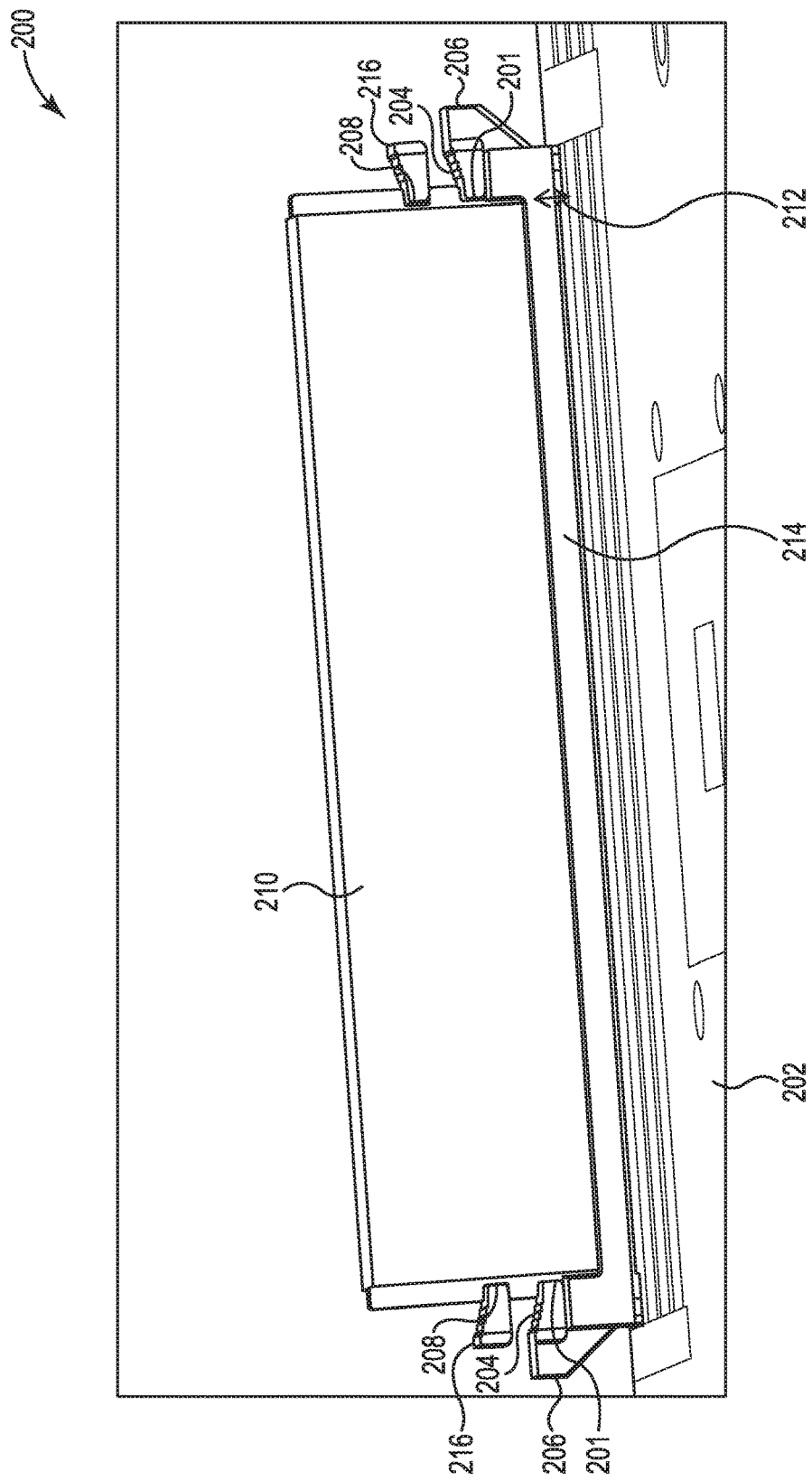
FIG. 2 illustrates a diagram of an example of a system according to the present disclosure.

FIG. 2 illustrates a diagram of an example of a system 200 according to the present disclosure. System 200 includes the same and/or similar components as system 100. For instance, system 200 can include DIMM 110 including first, upper notches 208 and second, lower notches 201. System 200 can include a connector apparatus including connector portions 204, body portion 214, and connector arms 206. The connector apparatus can sit a particular distance (e.g., 1.1 millimeters) from the surface of electronic component 202, as illustrated by seating plane 212. Examples are not limited to 1.1 millimeters. In some instances, the lowered seating plane 212 can fall below a particular threshold (e.g., fall below approximately 2.5 millimeters).

System 200 also includes connection portions 216 within the first notches 208. Connection portions 216 can represent, for example, additional electronic components that can be connected to DIMM 210 via notches 208 in a number of examples of the present disclosure. For instance, notches 208 can provide alignment and mechanical structure for heat management components, while notches 201 allow for a connector apparatus to connect electronic component 202 to DIMM 210. In another example, notches 208 can receive a component protector. The component protector can aid in protection of components (e.g., DIMM 210 components) that may be undesirably removed or "knocked off" of DIMM 210 in certain situations.

In some examples, heat management components can include, for example, a heat management system/structure and/or a heat spreader, among others. A heat spreader may include, for instance, a heat exchanger that moves heat between a heat source and a secondary heat exchanger. Heat may be "spread out", so that the secondary heat exchanger may be more fully utilized. In this example, air may flow over DIMM 210 as part of the heat spreading process.

A heat management system/structure may include, for instance, a system to transfer heat by collecting heat off DIMM 210 and other DIMM components and transfer the heat to a cooling system. In such an example, there may be no air flowing over DIMM 210.

Figure 3:
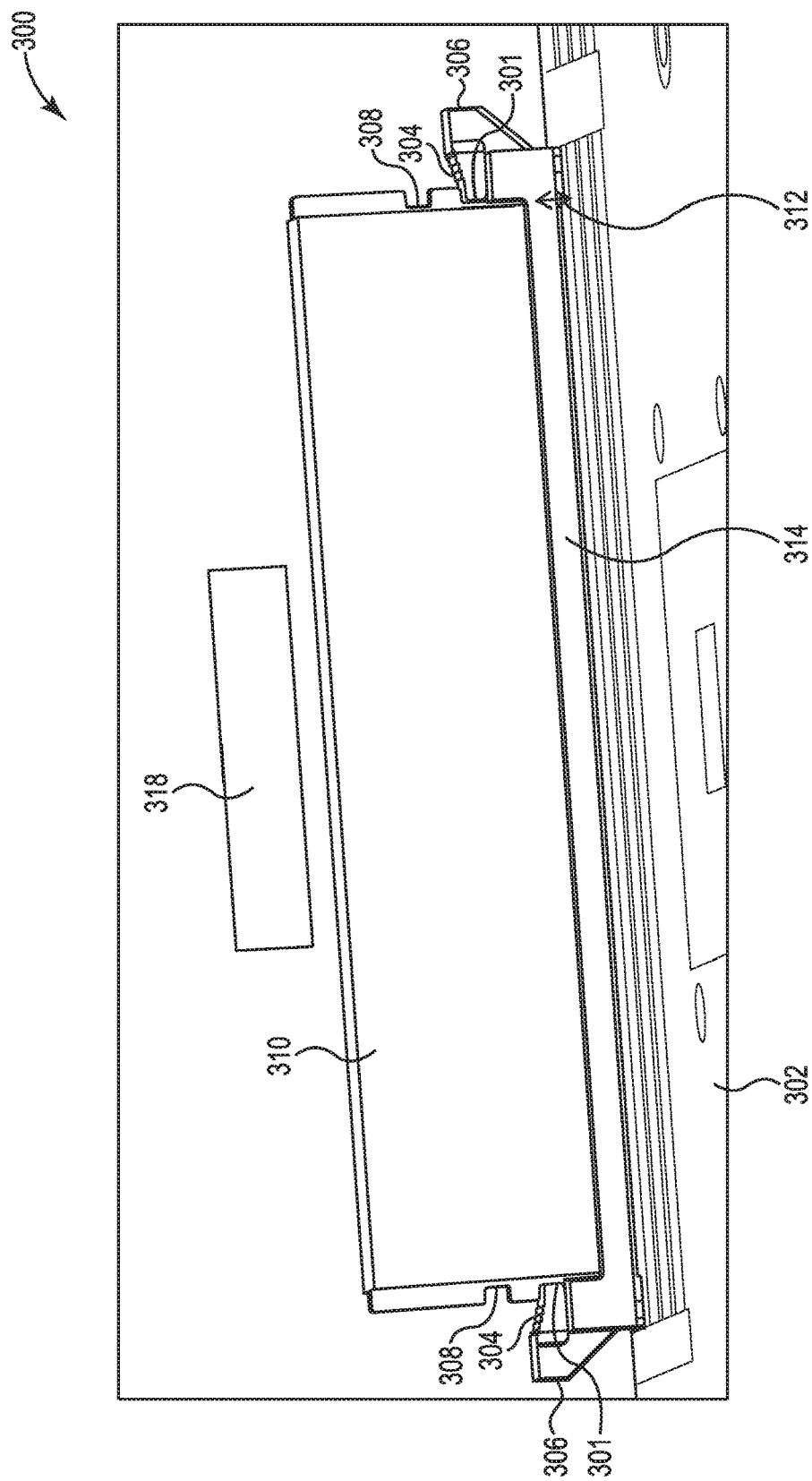
FIG. 3 illustrates a diagram of an example of a system according to the present disclosure.

FIG. 3 illustrates a diagram of an example of a system 300 according to the present disclosure. System 300 includes the same and/or similar components as system 100. For instance, system 300 can include DIMM 310 including first, upper notches 308 and second, lower notches 301. System 300 can include a connector apparatus including connector portions 304, body portion 314, and connector arms 306. The connector apparatus can sit a particular distance (e.g., 1.1 millimeters) from the surface of electronic component 302, as illustrated by seating plane 312.

System 300 can also include an electronic component 318 above DIMM 310. Because of a lower seating plane 312 as compared to other approaches, there may be space or room above DIMM 310 not available in other approaches. For example, server heights may be restricted due to industry standards or other reasons. For instance, servers may be restricted to 1.75 inches (or other height) or potentially higher in blade server configurations (e.g., 2.0 to 2.25 inches). As a result, the lower seating plane 312 (e.g., 1.1 mm compared to 2.5 mm) may be significant in offering available space for electronic components, air cooling channels, etc. As illustrated in FIG. 3, this space or room may be used to house, for example, an additional electronic component 318. For instance, additional electronic component 318 may include a hard drive located above DIMM 310, relative to electronic component 302. In a particular example, if each DIMM is approximately 6 inches long and 0.4 inches wide in a server including 16 DIMMs, 2.3 cubic inches of space may be gained volumetrically as a result of the lower seating plane 312.

While systems 100, 200, and 300 are illustrated as DDR4 DIMMs, examples are not so limited. For instance, systems 100, 200, and 300 may include other DIMMs, memristers, and/or other systems that utilize memory-style connectors as an interface but may have processing cores, photonics, or other functionality not bound by DDR3 or DDR4.

In the foregoing detailed description of the present disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure.

The figures herein follow a numbering convention in which the first digit corresponds to the drawing figure number and the remaining digits identify an element or component in the drawing. Elements shown in the various figures herein can be added, exchanged, and/or eliminated so as to provide a number of additional examples of the present disclosure. In addition, the proportion and the relative scale of the elements provided in the figures are intended to illustrate the examples of the present disclosure, and should not be taken in a limiting sense. Further, as used herein, "a number of" an element and/or feature can refer to one or more of such elements and/or features.

As used herein, "logic" is an alternative or additional processing resource to perform a particular action and/or function, etc., described herein, which includes hardware, e.g., various forms of transistor logic, application specific integrated circuits (ASICs), etc., as opposed to computer executable instructions, e.g., software firmware, etc., stored in memory and executable by a processor.

What is claimed:

1. A system, comprising:
   a dual in-line memory module (DIMM) comprising:
   a first notch to receive a first electronic component; and
   a second notch to receive a second electronic component; and
   a DIMM connector to connect the second electronic component to the DIMM via the second notch.

2. The system of claim 1, wherein the DIMM connector includes a double data rate fourth generation (DDR4) DIMM connector.

3. The system of claim 1, wherein the second electronic component includes a printed circuit board (PCB).

4. The system of claim 1, wherein the first notch is located above the second notch relative to the second electronic component.

5. The system of claim 1, wherein the first electronic component includes a heat spreader.

6. The system of claim 1, wherein the first electronic component includes a heat management system.

7. The system of claim 1, wherein the first electronic component includes a component protector.

8. A system, comprising;
   a dual in-line memory module (DIMM) comprising:
   a first notch to receive a heat management electronic component; and
   a second notch to receive a printed circuit board (PCB), wherein the second notch is located below the first notch, relative to the PCB;
   a first double data rate fourth generation (DDR4) DIMM connector to connect the DIMM to the heat management electronic component via the first notch;
   a second DDR4 DIMM connector o connect the PCB to the DIMM via the second notch,
   wherein a seating plane between the second DDR4 DIMM connector and the PCB falls within a threshold distance.

9. The system of claim 8 wherein the threshold distance is 1.1 millimeters.

10. The system of claim 8, including a hard drive located above the DIMM, relative to the PCB.

11. The system of claim 8 wherein the threshold distance includes falling below 2.5 millimeters.

\* \* \* \* \*